(12) United States Patent
Paparisto et al.

(10) Patent No.: US 7,548,474 B2
(45) Date of Patent: Jun. 16, 2009

(54) DEVICE FOR READING OUT A MEMORY CELL INCLUDING A REGULATING CIRCUIT WITH PARALLEL SWITCHING ELEMENTS, AND METHOD

(75) Inventors: Edvin Paparisto, München (DE); Stephan Rogl, Landshut (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/444,696

(22) Filed: Jun. 1, 2006

(65) Prior Publication Data

US 2006/0280008 A1 Dec. 14, 2006

(30) Foreign Application Priority Data

Jun. 1, 2005 (DE) .................. 10 2005 025 149

(51) Int. Cl.
*G11C 7/00* (2006.01)

(52) U.S. Cl. ...................................... 365/203

(58) Field of Classification Search .................. 365/203
See application file for complete search history.

(56) References Cited

U.S. PATENT DOCUMENTS

| 4,852,064 A | 7/1989 | Kim et al. |
| 6,233,186 B1 | 5/2001 | Tonda |
| 6,724,672 B2 * | 4/2004 | Nirschl ....................... 365/203 |
| 6,944,077 B2 * | 9/2005 | Morikawa ................... 365/204 |

* cited by examiner

*Primary Examiner*—VanThu Nguyen
(74) *Attorney, Agent, or Firm*—Dicke, Billig & Czaja, PLLC (57) ABSTRACT

A method for reading out a memory cell, and a device to be used for reading out a memory cell. In one embodiment, the device includes a first circuit and a second circuit for regulating a voltage present at a line that is adapted to be connected with the memory cell to a predetermined value, wherein said first circuit includes a switching element, and wherein said first circuit is configured such that said switching element is switched on during a first regulating phase and is switched off during a second regulating phase.

23 Claims, 4 Drawing Sheets

FIG 1

Prior Art

Prior Art

FIG 3

DEVICE FOR READING OUT A MEMORY CELL INCLUDING A REGULATING CIRCUIT WITH PARALLEL SWITCHING ELEMENTS, AND METHOD

CROSS-REFERENCE TO RELATED APPLICATIONS

This Utility Patent Application claims priority to German Patent Application No. DE 10 2005 025 149.8 filed on Jun. 1, 2005, which is incorporated herein by reference.

FIELD OF THE INVENTION

The invention relates to a device to be used for reading out a memory cell, and to a method for reading out a memory cell.

BACKGROUND

In the case of conventional memory devices, in particular conventional semiconductor memory devices, one differentiates between so-called functional memory devices (e.g. PLAs, PALs, etc.), and so-called table memory devices, e.g. ROM devices (ROM=Read Only Memory)—in particular PROMs, EPROMs, EEPROMs, flash memories, etc. —, and RAM devices (RAM=Random Access Memory or read-write memory), e.g. DRAMs and SRAMs.

A RAM device is a memory for storing data under a predetermined address and for reading out the data under this address again later.

Since as many memory cells as possible are to be accommodated in a RAM device, one has been trying to realize them as simple as possible.

In the case of SRAMs (SRAM=Static Random Access Memory), the individual memory cells consist e.g. of few, for instance 6, transistors, and in the case of so-called DRAMs (DRAM=Dynamic Random Access Memory) in general only of one single, correspondingly controlled capacitive element (e.g. a trench capacitor) with the capacitance of which one bit each can be stored as charge.

This charge, however, remains for a short time only. Therefore, a so-called "refresh" must be performed regularly, e.g. approximately every 64 ms.

In contrast to that, no "refresh" has to be performed in the case of SRAMs, i.e. the data stored in the memory cell remain stored as long as an appropriate supply voltage is fed to the SRAM.

In the case of non-volatile memory devices (NVMs), e.g. EPROMs, EEPROMs, flash memories, OTPs, etc., the stored data remain, however, stored even when the supply voltage is switched off.

The memory cells provided in the above-mentioned memory devices are each adapted to be connected to corresponding bit lines so as to transmit a data value to be read out from a memory cell or a data value to be read in to a memory cell.

On reading out a memory cell, an access transistor connected with a memory cell is first of all connected through by the activation or selection, respectively, of a word line, and the charge state stored in the memory cell is applied to the bit line. Later, the weak signal coming from the memory cell is amplified by a sense amplifier, or evaluated by an evaluator circuit, respectively.

Prior to the reading out of the memory cell, the corresponding bit line is precharged to a predetermined potential by a so-called precharge circuit that is connected with the corresponding bit line.

If a corresponding bit line is selected or activated, respectively, the parasitic capacitances thereof will first of all have to be charged. The corresponding charging current may, for instance, be provided by the above-mentioned precharge circuit and by further transistors that are connected between the bit line and the supply voltage.

The charging current results in a relatively high voltage drop at a node positioned between the above-mentioned evaluator circuit and the bit line. Before the evaluator circuit evaluates the charging current of the memory cell, the voltage at this node first has to achieve a predetermined target value. The result of this is relatively long access times.

For this and other reasons there is a need for the present invention.

SUMMARY

The present invention provides a method for reading out a memory cell, and a device to be used for reading out a memory cell. In one embodiment, the device includes a first circuit and a second circuit for regulating a voltage present at a line that is adapted to be connected with the memory cell to a predetermined value ($U_{ref}$), wherein said first circuit includes a switching element, and wherein said first circuit is configured such that said switching element is switched on during a first regulating phase and is switched off during a second regulating phase.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel device to be used for reading out a memory cell, and a novel method for reading out a memory cell, in particular a device and a method by means of which the access times during the reading out of a memory cell can be reduced.

In accordance with one embodiment of the invention, there is provided a device to be used for reading out a memory cell. The device includes a first circuit and a second circuit for regulating a voltage present at a line that is adapted to be connected with the memory cell to a predetermined value (Uref), wherein said first circuit comprises a switching element, and wherein said first circuit is configured such that said switching element is switched on during a first regulating phase and is switched off during a second regulating phase.

In parallel to the switching element of the first circuit, there is connected a further switching element that is connected with or that is adapted to be connected with a memory cell state evaluator circuit, said further switching element being switched off during the first regulating phase and being switched on during the second regulating phase.

In one embodiment, the second circuit includes a switching element that remains switched on during the first and the second regulating phases.

In accordance with a further aspect of the invention, there is provided a method for reading out a memory cell. The method includes regulating a voltage present at a line that is adapted to be connected with the memory cell to a predetermined value (Uref) by using a first and a second circuit, wherein said first circuit comprises a switching element that is switched on during a first phase of the voltage regulation. The switching element is switched off during a second phase of the voltage regulation. The memory cell is read out.

In one embodiment, the voltage present at the line that is adapted to be connected with the memory cell has, during the first regulating phase, a voltage value ranging below a further predetermined voltage value (Uref I).

The further predetermined voltage value (Uref I) is smaller than the predetermined voltage value (Uref).

The voltage present at the line (104, 106) that is adapted to be connected with the memory cell (102) has, during the second regulating phase, a voltage value ranging above the further predetermined voltage value (Uref I).

Figure 1:
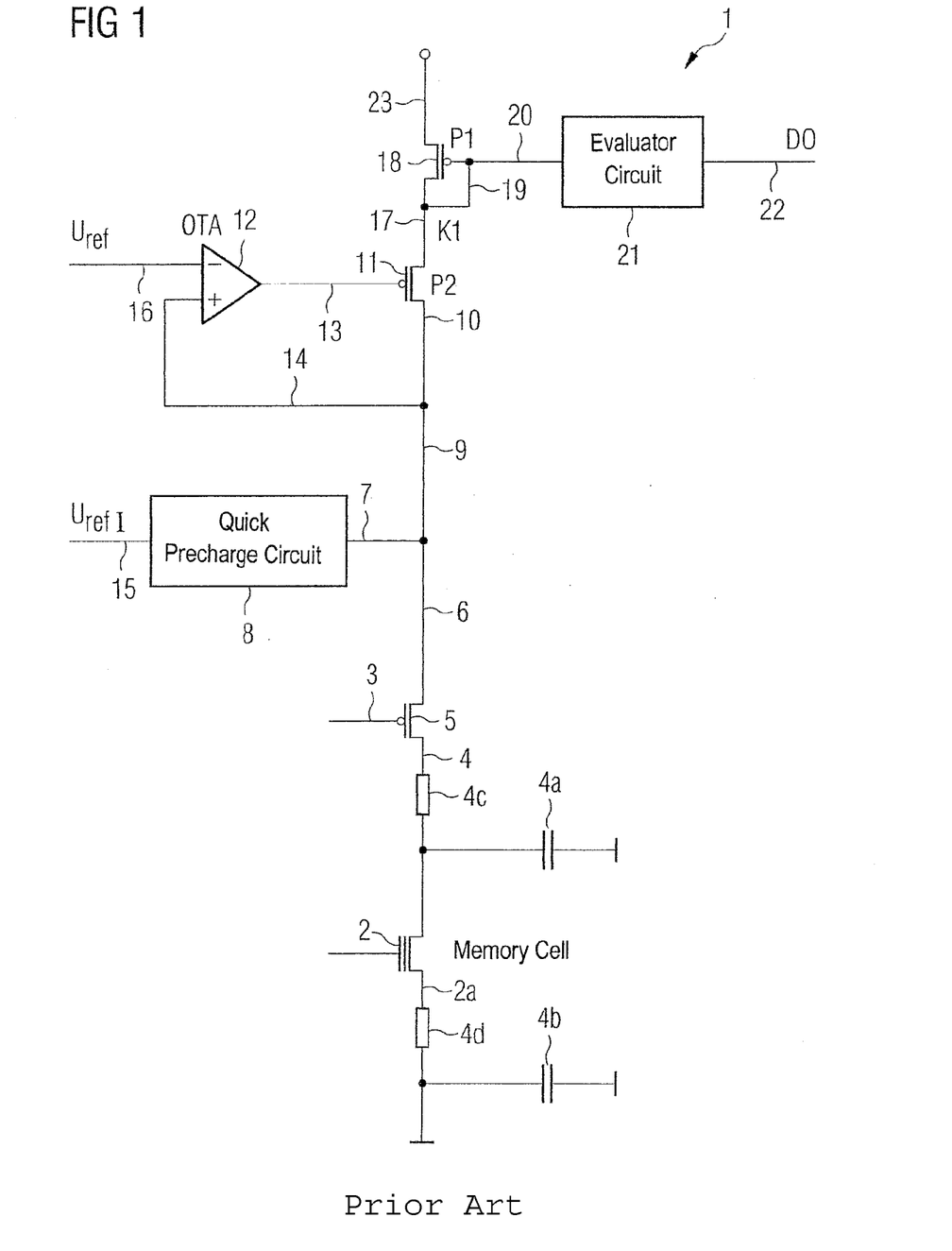
FIG. 1 illustrates a schematic representation of a section of a memory device according to prior art.

FIG. 1 schematically illustrates a section 1 of a memory device according to prior art, in particular a schematic representation of elements used during the reading out of a memory cell 2 in a conventional memory device.

The memory device may, for instance, be a RAM device (RAM=Random Access Memory or read-write-memory), e.g. a DRAM or SRAM, or a non-volatile memory device, e.g. a PROM, EPROM, EEPROM, flash memory, or OTP, etc.

As results from FIG. 1, each memory cell 2 of the memory device is connected to ground and is connected or adapted to be connected with a corresponding bit line 4.

The bit line 4 is connected to a transistor 5 (here: to the drain of a PMOS field effect transistor 5) that acts as an address selection transistor and that is adapted to be placed—for activating or selecting, respectively, the bit line 4—in a conductive state by applying an appropriate control signal (e.g. a "logic low" address signal illustrated in FIG. 2) to a control line 3 that is here connected with the gate of the PMOS field effect transistor 5.

The transistor 5 (here: the source of the PMOS field effect transistor 5) is connected, via a line 6 and a line 7 that is connected therewith, to an output of a quick precharge circuit 8, the input of which is connected with a line 15 to which a reference voltage Uref I is applied.

Additionally, the transistor 5 (here: the source of the PMOS field effect transistor 5) is connected, via the above-mentioned line 6 and lines 9, 10, with a transistor 11 (here: the drain of a PMOS field effect transistor 11 (transistor P2)).

The gate of the PMOS field effect transistor 11 is connected to the output of an operational amplifier 12 via a line 13.

The drain of the PMOS field effect transistor 11 is fed back to a plus input of the operational amplifier 12 via a line 14.

The minus input of the operational amplifier 12 is connected with a line 16 to which a (further) reference voltage Uref is applied.

The operational amplifier 12 and the transistor 11 together form a regulator for regulating the bit line voltage.

As results further from FIG. 1, the transistor 11 (here: the source of the PMOS field effect transistor 11) is, via a line 17, connected to a transistor 18 (here: the drain of a PMOS field effect transistor 18 (transistor P1)).

The transistor 18 (here: the source of the PMOS field effect transistor 18) is connected to the supply voltage via a line 23.

The gate of the PMOS field effect transistor 18 is—via a line 19—connected to the drain of the PMOS field effect transistor 18 and, via a line 20, to an input of an evaluator circuit 21, the output of which is connected with a line 22.

As results from FIG. 1 and the above explanations, a source connection 2a of the memory cell 2 may be positioned on a hard-wired (or e.g. also on a switched) ground potential.

If the bit line 4 is not selected or activated, respectively, the memory cell 2 discharges (if it is in a conductive state) on the bit line 4.

Figure 2:
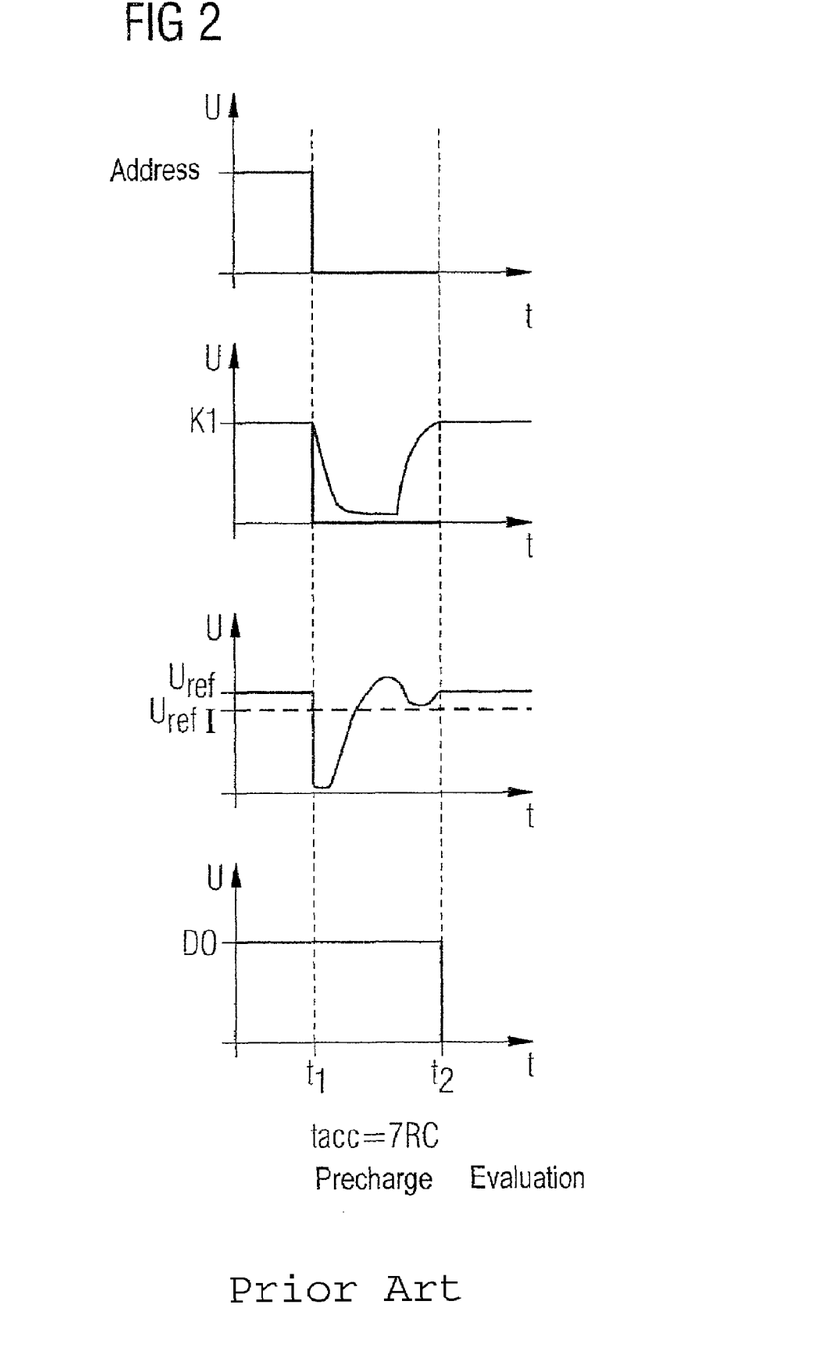
FIG. 2 illustrates a signal diagram for illustrating the time course of a plurality of voltages occurring during the reading out of a memory cell in the memory device section illustrated in FIG. 1.

If, in the circuit illustrated in FIG. 1, the bit line 4 is selected or activated, respectively, e.g. at the point in time t1 illustrated in FIG. 2 (i.e. the above-mentioned transistor 5 is placed in a conductive state, e.g. by changing the address signal illustrated in FIG. 2 from "logic high" to "logic low"), first of all the parasitic capacitances of the bit line 4 which have a parasitic capacitance C (illustrated by the capacitances 4a, 4b illustrated in FIG. 1) (and possibly further, not illustrated parasitic capacitances) have to be charged.

The charging current flows in this case through the above-mentioned precharge circuit 8 and the transistors 11 and 18 (transistors P2 and P1).

The charging current flowing through the transistor 11 (transistor P1) causes—as is also illustrated in FIG. 2—a comparatively large voltage drop at a node K1 between the transistor 18 (transistor P1) and the transistor 11 (transistor P2).

Before the evaluator circuit 21 can evaluate the charging current of the memory cell 2 and can, depending on the result of the evaluation, output a corresponding "logic high" or "logic low" evaluation signal DO at the line 22 (cf. FIG. 2), the voltage at the node K1 must reach a predetermined target value (cf. the point in time t2 illustrated in FIG. 2).

This results in a relatively long access time tacc=t2−t1.

The access time tacc=t2−t1 is in particular dependent on the capacitance C of the above-mentioned parasitic capacitances of the bit line 4 (and of further, not illustrated parasitic capacitances), and on the (parasitic) resistance R caused by the transistors 18, 11, 5 and the lines 4, 6, etc. (in particular e.g. also the parasitic resistance of the bit line 4 (illustrated by the parasitic resistances 4c, 4d illustrated in FIG. 1)) and results in tacc≈7 RC.

Figure 3:
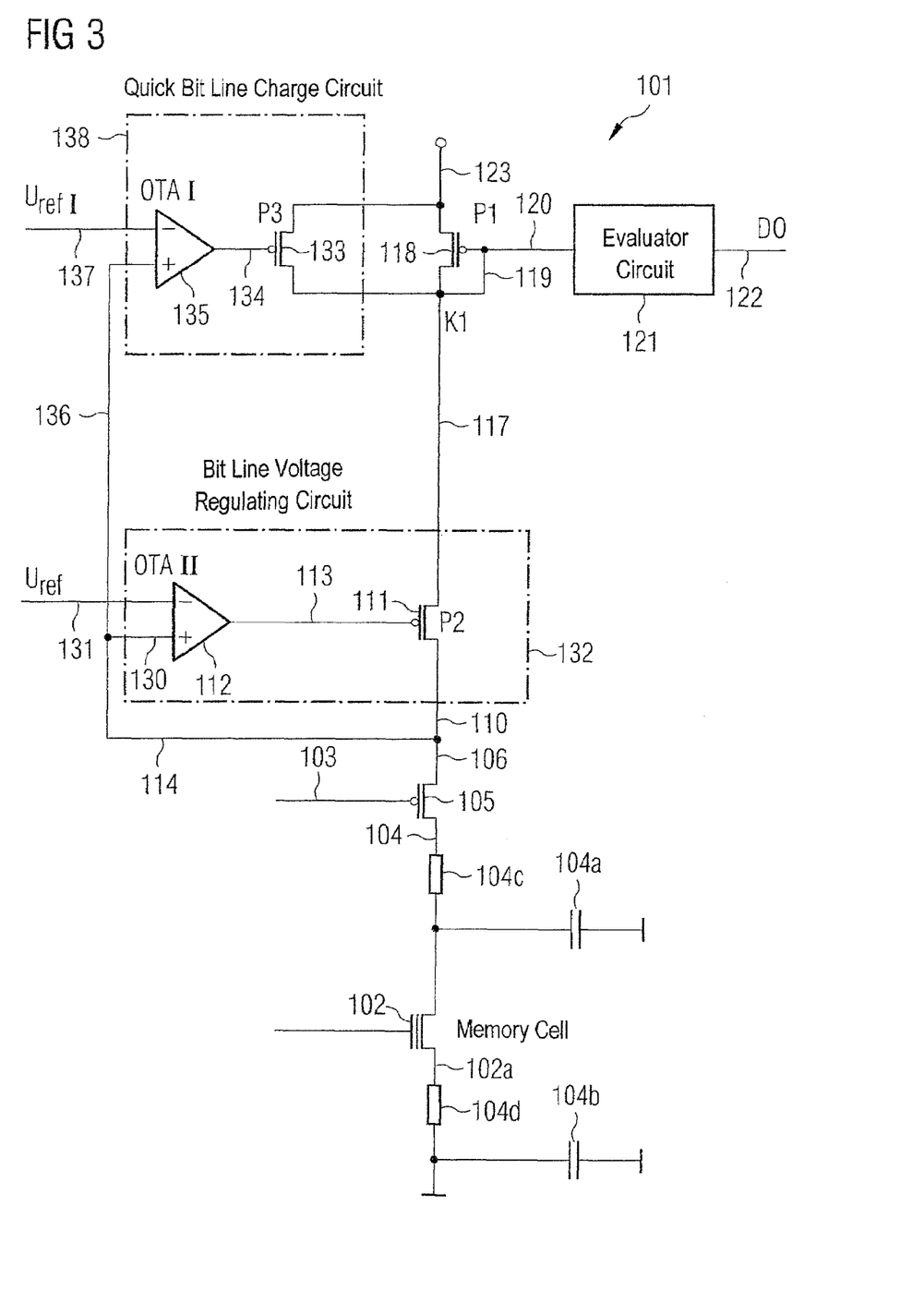
FIG. 3 illustrates a schematic representation of a section of a memory device according to an embodiment of the present invention.

FIG. 3 schematically illustrates a section 101 of a memory device in accordance with an embodiment of the invention, in particular a schematic representation of elements used during the reading out of a memory cell 102 in the embodiment illustrated here.

The memory device may, for instance, be a RAM device (RAM=Random Access Memory or read-write-memory), e.g. a DRAM or SRAM, or—particularly advantageously—a non-volatile memory device, e.g. a PROM, EPROM, EEPROM, flash memory, or OTP, etc.

As results from FIG. 3, in the present embodiment the memory cells 102 of the memory device are each connected to ground and are each connected or adapted to be connected with one out of a plurality of bit lines 104.

As results further from FIG. 3, the respective bit line 104 is connected to a respective transistor 105 (here: to the respective drain of a PMOS field effect transistor 105) which acts as an address selection transistor and which is adapted to be placed—for activating or selecting, respectively, the bit line 104—in a conductive state by applying an appropriate control signal (e.g. a "logic low" address signal illustrated in FIG. 4) at a control line 103 that is here connected with the gate of the PMOS field effect transistor 105.

The transistor 105 (here: the source of the PMOS field effect transistor 105) is connected with a transistor 111 (here: the drain of a PMOS field effect transistor 111 (transistor P2)) via a line 106 and a line 110 that is connected therewith.

The gate of the PMOS field effect transistor 111 is, via a line 113, connected to the output of an operational amplifier 112.

The drain of the PMOS field effect transistor 111 is, via a line 114 and a line 130 that is connected therewith, fed back to a plus input of the operational amplifier 112.

The minus input of the operational amplifier 112 is connected with a line 131 at which a (specifically predetermined, constant) reference voltage Uref is applied.

The operational amplifier 112 and the transistor 111 together form—as will be explained in more detail in the following—a regulator ("OTA II") for regulating the bit line voltage ("bit line voltage regulating circuit" 132).

As results further from FIG. 3, the transistor 111 (here: the source of the PMOS field effect transistor 111) is connected, via a line 117, with a transistor 118 (here: the drain of a PMOS field effect transistor 118 (transistor P1)) and a transistor 133 (here: the drain of a PMOS field effect transistor 133 (transistor P3)).

The gate of the PMOS field effect transistor 133 is, via a line 134, connected with the output of a (further) operational amplifier 135.

The drain of the PMOS field effect transistor 111 (transistor P2) (and thus—indirectly—the drain of the PMOS field effect transistor 133 (transistor P3) (and of the PMOS field effect transistor 118 (transistor P1))) is, via the above-mentioned line 114 and a line 136 that is connected therewith, fed back to a plus input of a (further) operational amplifier 135.

The minus input of the operational amplifier 135 is connected with a line 137 at which a (further (specifically predetermined, constant) reference voltage Uref I is applied.

The operational amplifier 135 and the transistor 133 together form—as will be explained in more detail in the following—a—further—regulator ("OTA I") for the quick charging of the bit line 104 ("quick bit line charge circuit" 138).

The transistor 133 (here: the source of the PMOS field effect transistor 138) and the—parallel-connected—transistor 118 (here: the source of the PMOS field effect transistor 118) are connected to the supply voltage via a line 123.

The gate of the PMOS field effect transistor 118 is—via a line 119—connected to the drain of the PMOS field effect transistor 118 (and the drain of the PMOS field effect transistor 133), and via a line 120 connected with an input of an evaluator circuit 121, the output of which is connected with a line 122.

As results from FIG. 3 and the above explanations, a source connection 102a of the memory cell 102 may be positioned on a hard-wired (or e.g. also on a switched) ground potential.

Figure 4:
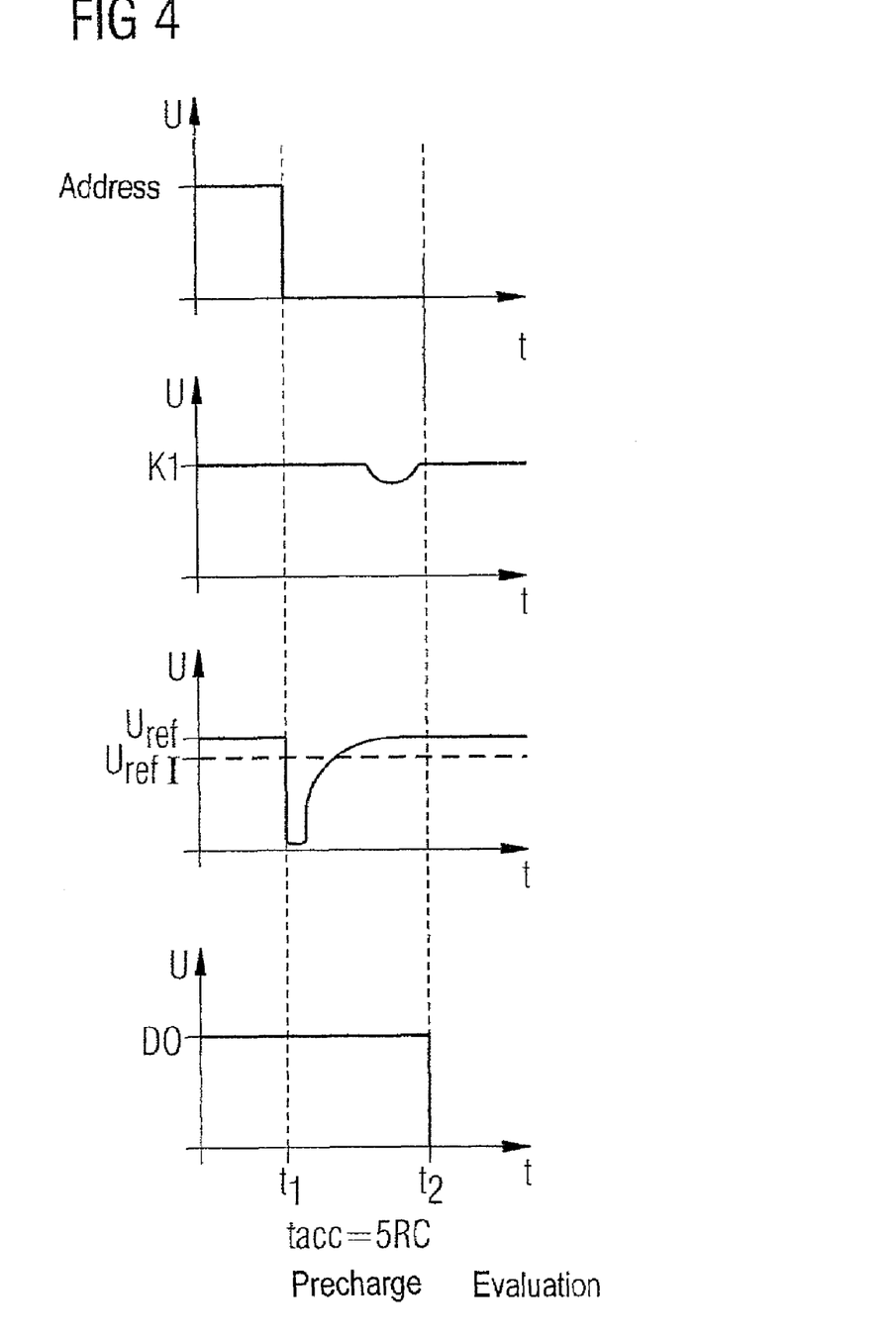
FIG. 4 illustrates a signal diagram for illustrating the time course of a plurality of voltages occurring during the reading out of a memory cell in the memory device section illustrated in FIG. 3.

For reading out the memory cell 102, the bit line 104 is selected or activated, respectively, in the circuit illustrated in FIG. 3 e.g. at the point in time t1 illustrated in FIG. 4 (prior to that, a—not illustrated—access transistor that is connected with the memory cell 104 can be connected through by the activation or selection, respectively, of a corresponding—not illustrated—word line, and the memory cell 102 can thus be connected conductively with the bit line 104).

For selecting or activating, respectively, the bit line 104, the above-mentioned transistor 105 is placed in a conductive state, e.g. by changing the address signal illustrated in FIG. 2 from "logic high" to "logic low".

The (specifically predetermined, constant) reference voltage Uref input into the above-mentioned regulator OTA II (or the bit line voltage regulating circuit 132, respectively) via the above-mentioned line 131 is greater than the (specifically predetermined, constant) reference voltage Uref I input into the above-mentioned regulator OTA I (or the bit line charge circuit 138, respectively) via the above-mentioned line 137 (i.e. there applies Uref I<Uref.)

For instance, there is Uref I<0.95 Uref (in particular there may, for instance, apply: Uref I<0.9 Uref, or Uref I<0.85 Uref, or Uref I<0.8 Uref, etc.). Uref I may, for instance, range between 0.6 Uref and 0.95 Uref, or e.g. between 0.75 Uref and 0.9 Uref, etc.

In the present embodiment, Uref I may, for instance, range between 50 mV and 600 mV, in particular e.g. between 200 mV and 400 mV, etc.

The above-mentioned differences between the voltages Uref I and Uref result in that the reading out of the memory cell 104 is—with respect to the behavior of the regulators OTA II and OTA I (or of the bit line voltage regulating circuit 132 and the bit line charge circuit 138, respectively)—performed in two different phases:

In a first phase (immediately after the selecting or activating, respectively, of the bit line 104 (point in time t1)), the transistor 133 (transistor P3) of the regulator OTA I (bit line charge circuit 138) and the transistor 111 (transistor P2) of the regulator OTA II (bit line voltage regulating circuit 132) are fully controlled, i.e. in a highly conductive state.

Contrary to that, the above-mentioned transistor 118 (transistor P1) is, in the above-mentioned first phase (immediately after the selecting or activating, respectively, of the bit line 104), in a non-conductive state.

The transistor 118 is connected as a diode; during the above-mentioned first phase immediately after the selecting or activating, respectively, of the bit line 104, the gate-source voltage UGS of the transistor 118 is so small that the transistor 118 is or gets locked.

The charging of the parasitic capacitances of the bit line 104 which have a parasitic capacitance C, which is first of all necessary after the selecting or activating, respectively, of the bit line 104 (illustrated by the capacitances 104a, 104b illustrated in FIG. 1) (and possibly of further, not illustrated parasitic capacitances) is then performed—other than with the circuit illustrated in FIG. 1—first of all (i.e. during the above-mentioned first phase) via the transistor 133 (transistor P3) and the transistor 111 (transistor P2).

Contrary to that, no charging current flows through the transistor 118 (transistor P1)—that is connected as a diode—during the above-mentioned first phase.

The charging current flowing through the transistor 133 (transistor P3) (and the transistor 111 (transistor P2)) during the first phase is relatively high.

Consequently, the parasitic capacitances of the bit line 104 (and possibly the other, not illustrated parasitic capacitances) are charged relatively quickly.

The voltage at the bit line 104 then increases relatively quickly until it approaches the value of the above-mentioned reference voltage Uref I present at the above-mentioned line 137 (i.e. the regulator OTA I or the bit line charge circuit 138). The voltage output by the regulator OA I or the bit line charge circuit 138 at the line 134, i.e. the gate of the transistor 133 (transistor P3) then changes its value until the transistor 133 (transistor P3)—if the voltage at the bit line 104 corresponds to the value of the reference voltage Uref I—has been placed in a non-conductive state (beginning of the second phase of the above-mentioned memory cell read-out procedure).

The above-explained fact that the voltage at the bit line 104, during the above-mentioned first phase, relatively quickly reaches the value of the reference voltage Uref I present at the line 137, is one of the reasons for the fact that a relatively short access time can be achieved in the present embodiment.

Due to the switching of the transistor 133 (transistor P3) effected at the beginning of the second phase and the increasing of the gate-source voltage UGS of the transistor 118—that is connected as a diode—caused thereby, the transistor 118 (transistor P1) is, at the beginning of the above-mentioned second phase of the memory cell read-out procedure, placed from the above-mentioned locked state in a conductive state (so that it is adapted to (later) act as a "current mirror" for the memory cell 104 and the evaluator circuit 121).

The transistor 111 (transistor P2) of the regulator OTA II (bit line voltage regulating circuit 132) first of all remains in the above-mentioned fully controlled, i.e. highly conductive state—since there applies, as explained above: Uref I<Uref.

The further charging of the above-mentioned parasitic capacitances is effected in the above-mentioned second phase—other than in the above-mentioned first phase—via the transistor 118 (transistor P1) (and further via the transistor 111 (transistor P2)); contrary to that, during the second phase only little or no more charge current flows via the transistor 133 (transistor P3).

The charging current flowing through the transistor 118 (transistor P1) and the transistor 111 (transistor P2) during the second phase is relatively small, in particular substantially smaller (e.g. by more than the half or two thirds smaller) than the charging current flowing through the transistor 133 (transistor P3) and the transistor 111 (transistor P2) during the above-mentioned first phase.

The charging current flowing through the transistors 118, 111 (transistors P1, P2) results in a further increasing of the voltage value at the bit line 104.

If the voltage at the bit line 104 approaches the value of the above-mentioned reference value Uref present at the line 131 (i.e. the regulator OTA II or the regulating circuit 132), the voltage output by the regulator OTA II or the bit line voltage regulating circuit 132 at the line 113, i.e. the gate of the transistor 111 (transistor P2) changes its value until the transistor 111 (transistor P2) is—if the voltage at the bit line 104 corresponds to the value of the reference voltage Uref at the line 131—no longer in the above-mentioned fully controlled state.

Due to the above-mentioned only relatively small charge current flowing during the second phase (during which the voltage at the bit line 104 is regulated from the above-mentioned reference voltage value Uref I to the value of the reference voltage Uref present at the line 131), only a comparatively small voltage drop is caused in this phase at a node between the transistors 133, 118 (transistors P3, P1) and the transistor 111 (transistor P2)—as is also illustrated in FIG. 4.

Before the evaluator circuit 121 can evaluate the charging current of the memory cell 102 and can output, depending on the result of the evaluation, a correspondingly "logic high" or "logic low" evaluation signal DO at the line 122 (cf. FIG. 4), the voltage at the above-mentioned node K1 has to reach a predetermined target value (cf. the point in time t2 illustrated in FIG. 4).

The fact that this is—due to the comparatively small voltage drop at the above-mentioned node K1 between the transistors 133, 118 (transistors P3, P1)—the case relatively quickly, is another reason for the fact that a relatively short access time tacc=t2−t1 can be achieved in the present embodiment.

The resulting access time tacc=t2−t1 is i.a. dependent on the capacitance C of the above-mentioned parasitic capacitances of the bit line 104 (and of further, not illustrated parasitic capacitances) and the (parasitic) resistance R caused by the transistors 133, 111 (or 118, 111) and the lines 104, 106, etc. (in particular e.g. also the parasitic resistance of the bit line 104 (illustrated by the parasitic resistances 104c, 104d illustrated in FIG. 1)).

In the present embodiment, there results for the access time e.g. merely tacc≈5RC.

As explained above, the entire charging current (i.e. the charging current during both the above-mentioned first and the above-mentioned second phases) flows through the transistor 111 (transistor P2) of the regulator OTA II (bit line voltage regulating circuit 132). The regulator OTA II (bit line voltage regulating circuit 132) is in the operating point.

This enables a quick and smooth switching between the precharging of the bit line 104 to the reference voltage Uref (during the above-mentioned first and second phases) and the subsequent evaluation of the charging state of the memory cell 102 (by evaluation of the charging current delivered therefrom by the evaluator circuit 121 during a further, third phase of the memory cell read-out procedure which follows the above-mentioned first and second phases).

Thus, the noise portion of the circuit elements serving the precharging of the bit line 104 in the evaluation process is reduced, and an (increased) stability of the circuit is achieved.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A device to be used for reading out a memory cell, comprising:
   a first circuit and a second circuit for regulating a voltage present at a line that is adapted to be connected with the memory cell to a predetermined value;

wherein said first circuit comprises a switching element; and wherein said first circuit is configured such that said switching element is switched on during a first regulating phase and is switched off during a second regulating phase, and wherein, in parallel to said switching element of said first circuit, there is connected a further switching element that is connected or adapted to be connected with a memory cell state evaluation circuit.

2. The device according to claim 1, wherein said second circuit comprises a switching element, and wherein said second circuit is configured such that said switching element remains switched on during said first and second regulating phases.

3. The device according to claim 1, wherein, during the first regulating phase, the voltage present at the line that is adapted to be connected with said memory cell has a voltage value ranging below a farther predetermined voltage value, wherein said farther predetermined voltage value is smaller than said predetermined voltage value.

4. The device according to claim 1, wherein said first circuit is configured such that said further switching element is switched off during the first regulating phase and is switched on during the second regulating phase.

5. The device according to claim 1, wherein said memory cell is a non-volatile memory cell.

6. The device according to claim 5, wherein said memory cell is a PROM, EPROM, EEPROM, flash, or OTP memory cell.

7. The device according to claim 1, wherein said switching element of said first circuit and said further switching element are transistors.

8. The device according to claim 7, wherein the transistors are MOS transistors.

9. The device according to claim 8, wherein, with the MOS transistor forming the further switching element, the gate is connected with the drain-source-path by means of a line.

10. The device according to claim 8, wherein, with the MOS transistors forming said further switching element and said switching element of said first circuit, the drains and sources are connected with each other.

11. A method for reading out a memory cell, comprising:
regulating a voltage present at a line that is adapted to be connected with the memory cell to a predetermined value by using a first and a second circuit, wherein said first circuit comprises a switching element that is switched on during a first phase of voltage regulation;
switching off said switching element during a second phase of voltage regulation;
reading out said memory cell; and
wherein, in parallel to said switching element of said first circuit, there is connected a further switching element that is connected or adapted to be connected with a memory cell state evaluator circuit, said further switching element being switched off during the first regulating phase and being switched on during the second regulating phase.

12. The method according to claim 11, wherein said second circuit comprises a switching element that remains switched on during the first and second regulating phases.

13. The method according to claim 11, wherein, during the first regulating phase, the voltage present at the line that is adapted to be connected with said memory cell has a voltage value ranging below a farther predetermined voltage value, wherein said farther predetermined voltage value is smaller than said predetermined voltage value.

14. The method according to claim 13, wherein, during the second regulating phase, the voltage present at the line that is adapted to be connected with said memory cell has a voltage value ranging above said farther predetermined voltage value.

15. A memory comprising:
a memory cell; and
a device to be used for reading out a memory cell, comprising:
a first circuit and a second circuit for regulating a voltage present at a line that is adapted to be connected with the memory cell to a predetermined value;
wherein said first circuit comprises a switching element;
wherein said first circuit is configured such that said switching element is switched on during a first regulating phase and is switched off during a second regulating phase; and
wherein, in parallel to said switching element of said first circuit, there is connected a further switching element that is connected or adapted to be connected with a memory cell state evaluation circuit.

16. The memory according to claim 15, wherein said second circuit comprises a switching element, and wherein said second circuit is configured such that said switching element remains switched on during said first and second regulating phases.

17. The memory according to claim 16, wherein, during the first regulating phase, the voltage present at the line that is adapted to be connected with said memory cell has a voltage value ranging below a farther predetermined voltage value, wherein said farther predetermined voltage value is smaller than said predetermined voltage value.

18. The device according to claim 15, wherein said first circuit is configured such that said farther switching element is switched off during the first regulating phase and is switched on during the second regulating phase.

19. The device according to claim 15, wherein said memory cell is a non-volatile memory cell.

20. The device according to claim 15, wherein said switching element of said first circuit and said further switching element are transistors.

21. The device according to claim 20, wherein the transistors are MOS transistors, wherein, with the MOS transistor forming the further switching element, the gate is connected with the drain-source-path by means of a line, wherein, with the MOS transistors forming said further switching element and said switching element of said first circuit, the drains and sources are connected with each other.

22. A device to be used for reading out a memory cell, comprising:
means for providing a first circuit and means for providing a second circuit for regulating a voltage present at a line that is adapted to be connected with the memory cell to a predetermined value;
wherein said first circuit means comprises a switching element; and
wherein said first circuit means is configured such that said switching element is switched on during a first regulating phase and is switched off during a second regulating phase; and
wherein, in parallel to said switching element of said first circuit, there is connected a further switching element that is connected or adapted to be connected with a memory cell state evaluation circuit.

23. A device to be used for reading out a memory cell, comprising:
- a first feedback regulating circuit; and
- a second feedback regulating circuit for regulating a voltage present ata a line that is adapted to be connected with the memory cell to a first predetermined value,
- wherein said first feedback regulating circuit comprises a switching element, and
- wherein said first feedback regulating circuit is configured such that said switching element is switched on during a first regulating phase and is switched off during a second regulating phase in reaction to the voltage present at the line reaching a second predetermined value.

* * * * *